United States Patent
Chen et al.

(10) Patent No.: US 9,590,206 B2
(45) Date of Patent: Mar. 7, 2017

(54) OLED PACKAGE DEVICE AND PACKAGE METHOD OF OLED PANEL

(71) Applicant: Shenzhen China Star Optoelectronics Technology Co., Ltd., Shenzhen, Guangdong (CN)

(72) Inventors: Lindou Chen, Guangdong (CN); Kai Shi, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 226 days.

(21) Appl. No.: 14/384,487

(22) PCT Filed: Jul. 14, 2014

(86) PCT No.: PCT/CN2014/082130
§ 371 (c)(1),
(2) Date: Sep. 11, 2014

(87) PCT Pub. No.: WO2015/196519
PCT Pub. Date: Dec. 30, 2015

(65) Prior Publication Data
US 2016/0240812 A1    Aug. 18, 2016

(30) Foreign Application Priority Data
Jun. 24, 2014    (CN) .......................... 2014 1 0289640

(51) Int. Cl.
H01L 51/52    (2006.01)
H01L 51/56    (2006.01)
G09G 3/34    (2006.01)

(52) U.S. Cl.
CPC ....... *H01L 51/5237* (2013.01); *G09G 3/3406* (2013.01); *H01L 51/529* (2013.01); *H01L 51/56* (2013.01); *H01L 2251/556* (2013.01)

(58) Field of Classification Search
CPC .... H01L 51/5237; H01L 51/56; H01L 51/529
See application file for complete search history.

(56) References Cited

FOREIGN PATENT DOCUMENTS

| CN | 1925704 A | 3/2007 |
|----|-----------|--------|
| CN | 101997089 A | 3/2011 |
| CN | 102231429 A * | 11/2011 |
| CN | 103178214 A * | 6/2013 |
| JP | 2005243413 A | 9/2005 |

* cited by examiner

*Primary Examiner* — Joseph L Williams
(74) *Attorney, Agent, or Firm* — Andrew C. Cheng

(57) ABSTRACT

The present invention provides an OLED package device and a package method of an OLED panel. The package device comprises: a base body (10), a lower stage (30) installed on the base body (10) and a heating device (50) installed between the base body (10) and the lower stage (30), and the lower stage (30) is employed to load a package plate, and the heating device (50) can heat the lower stage (30), and the lower stage (30) passes heat to the package plate for heating up the package plate. Using the device, it is capable of solving issue of existing bubbles in underfill which is under filled as implementing Dam & Fill package, and accordingly to improve the package result, to raise the performance of the OLED elements, and to extend the lifetime of the OLED elements.

11 Claims, 7 Drawing Sheets

OLED PACKAGE DEVICE AND PACKAGE METHOD OF OLED PANEL

FIELD OF THE INVENTION

The present invention relates to a display skill field, and more particularly to an OLED package device and a package method of an OLED panel.

BACKGROUND OF THE INVENTION

In the display skill field, Liquid Crystal Display (LCD), Organic Light Emitting Diode (OLED) and other panel display skills have been gradually replaced the CRT displays. The OLED possesses many outstanding properties of self-illumination, low driving voltage, high luminescence efficiency, fast response, high clarity and contrast, near 180° view angle, wide range of working temperature, applicability of flexible display and large scale full color display. The OLED is considered as most potential flat panel display technology.

At present, the most significant issue restricting the development of OLED industry and the biggest defect of the OLED is the shot life time of the OLED. The root cause of the shot lifetime for the OLED is the electrode and organic material are extremely sensitive to the moisture and the oxygen. Therefore, an efficient package of preventing the moisture and the oxygen into the interior of the OLED is very important for extending the lifetime of the OLED and guaranteeing the performance of the OLED.

The key of the efficient package for the OLED is to control the package quality during the factory manufacture of the OLED for ensuring the availability of the OLED elements. The package of the OLED can be categorized and mainly comprises several types of: drier package, UV glue package (Dam only), UV glue and underfill package (Dam & Fill package), glass glue package (Frit package) and etc. Among these, the Dam & Fill package possesses advantages of simple art, applicability of large size package, flexible package procedure, stability and reliability and etc. More and more applications have been derived therefrom and the manufacture cost can be effectively reduced.

Package is implemented by the package device. Therefore, the package device is the footstone of guaranteeing the validity of OLED element package. In general, the package line of the OLED element package mainly comprises Buffer, USC, Loader, Multi, VAS, UV Cure, Unloader and etc. The main function of the VAS is to laminate the OLED substrate and the package plate. The quality of the lamination directly affects the package result. The VAS is the one of the most significant and important devices in the package line.

As shown in FIG. 1 and FIG. 2, the present package method of a Dam & Fill package method of the OLED panel is: coating seal glue continuously on a package plate 100 to form an inner glue frame 200 and an outer glue frame 300; underfill 400 is dispensed drop by drop and intermittently; then, package plate 100 and the OLED substrate are laminated in a VAS machine. Because the viscosity of the underfill 400 is lower, the underfill 400 is spread to fill in the area surround by the inner glue frame 200 under pressure during the lamination process; finally, an UV light is utilized to irradiate the seal glue and the underfill and solidify both. Accordingly, packaging the OLED substrate by the package plate 100 is realized.

However, in actual manufacture processes, gaps among the droplets of the underfill 400 may become bubbles after the lamination of the package plate 100 and the OLED substrate. However, the coefficient of viscosity of the underfill 400 is large and for the bubbles in the underfill 400 it is hard to over come the drag force to be drawn out. The situation of remaining bubbles because underfill 400 cannot fill in the area surrounded by the inner glue frame 200 may often occur and affect the performance and the lifetime of the OLED elements. The issue of existing bubbles in underfill which is under filled can be solved by improvement of the VAS device.

SUMMARY OF THE INVENTION

An objective of the present invention is to provide an OLED package device. Using the device, it is capable of solving issue of existing bubbles in underfill which is under filled as implementing Dam & Fill package, and accordingly to improve the package result, to raise the performance of the OLED elements, and to extend the lifetime of the OLED elements.

Another objective of the present invention is to provide a package method of an OLED panel capable of making no bubble among adhesives of the underfill and filling in the frame for guaranteeing a good package result, and accordingly to raise the performance of the OLED elements, and to extend the lifetime of the OLED elements.

For realizing the aforesaid objective, the present invention provides an OLED package device, comprising: a base body, a lower stage installed on the base body and a heating device installed between the base body and the lower stage, and the lower stage is employed to load a package plate, and the heating device can heat the lower stage, and the lower stage passes heat to the package plate for heating up the package plate.

The heating device starts to heat as implementing as extracting air.

The heating device heats for heating up the package plate, and the temperature of the package plate is controlled under 80° C.

The temperature of the package plate is controlled in a range of 30-50° C.

The heating device stops heating when an OLED substrate and the package plate are being laminated.

The present invention further provides an OLED package device, comprising: a base body, a lower stage installed on the base body and a heating device installed between the base body and the lower stage, and the lower stage is employed to load a package plate, and the heating device can heat the lower stage, and the lower stage passes heat to the package plate for heating up the package plate;

the heating device starts to heat as implementing as extracting air;

the heating device heats for heating up the package plate;

the temperature of the package plate is controlled in a range of 30-50° C.;

the heating device stops heating when an OLED substrate and the package plate are being laminated.

The present invention further provides a package method of an OLED panel, comprising steps of:

step 1, providing an OLED substrate and a package substrate, and the package substrate comprises a seal frame and underfill in the seal frame;

step 2, delivering the OLED substrate and the package substrate to a package stage and implementing air extraction;

step 3, heating up the package substrate;

step 4, aligning the OLED substrate and the package substrate;

step 5, laminating the OLED substrate and the package substrate;

step 6, stopping heating the package substrate;

step 7, charging air and drawing out the OLED substrate and the package substrate which have been laminated;

step 8, solidifying the seal frame and the underfill.

The package plate starts to be heated as implementing as extracting air.

In the step 3 of heating up the package substrate, the temperature of the package plate is controlled under 80° C.

In the step 3 of heating up the package substrate, the temperature of the package plate is controlled in a range of 30-50° C.

The heating device stops heating when an OLED substrate and the package plate are being laminated.

The benefits of the present invention are: in the OLED package device of the present invention, with installing the heating device between the base body and the lower stage, and the heating device heats up the package plate. The viscosity of the underfill is descended after heating up. The drag force can be diminished during the air extraction to allow the bubbles in the underfill get easy to be squeezed out. Accordingly, the issue of existing bubbles in underfill which is under filled as implementing Dam & Fill package can be solved. The package result can be improved. The performance of the OLED elements can be raised and the lifetime of the OLED elements can be extended. With heating the package substrate according to the package method of the OLED panel, the viscosity of the underfill is descended after heating up. The drag force can be diminished during the air extraction to allow the bubbles in the underfill get easy to be squeezed out. It is capable of making no bubble among adhesives of the underfill and filling the underfill in the frame for guaranteeing a good package result. Accordingly, the performance of the OLED elements can be raised, and the lifetime of the OLED elements can be extended.

In order to better understand the characteristics and technical aspect of the invention, please refer to the following detailed description of the present invention is concerned with the diagrams, however, provide reference to the accompanying drawings and description only and is not intended to be limiting of the invention.

BRIEF DESCRIPTION OF THE DRAWINGS

The technical solution, as well as beneficial advantages, of the present invention will be apparent from the following detailed description of an embodiment of the present invention, with reference to the attached drawings.

In drawings.

DETAILED DESCRIPTION OF PREFERRED EMBODIMENTS

Embodiments of the present invention are described in detail with the technical matters, structural features, achieved objects, and effects with reference to the accompanying drawings as follows.

Figure 1:
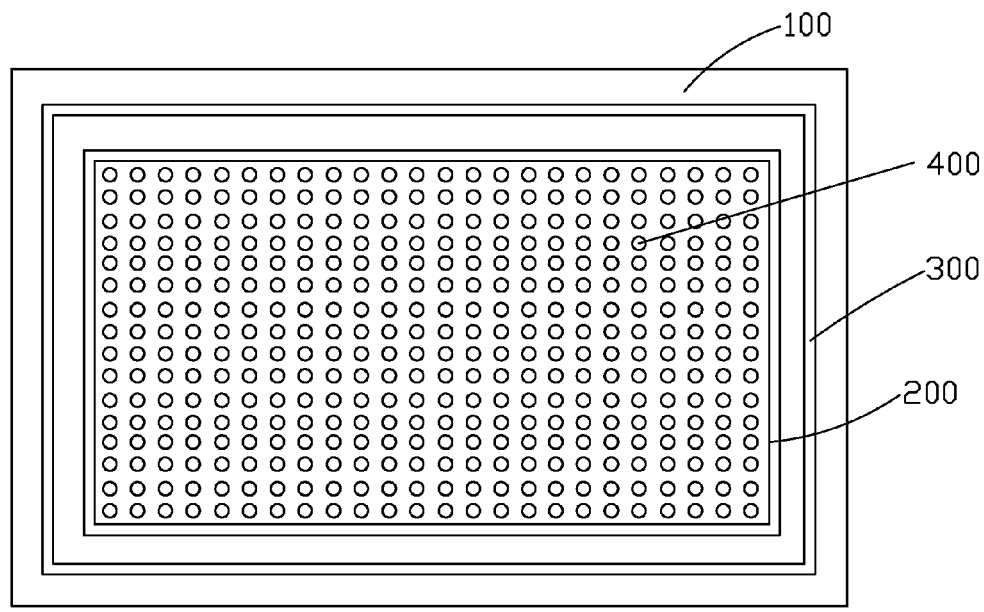
FIG. 1 is a diagram of a package plate before lamination of the package plate and an OLED substrate according to a package method of an OLED substrate of prior art.
Figure 2:
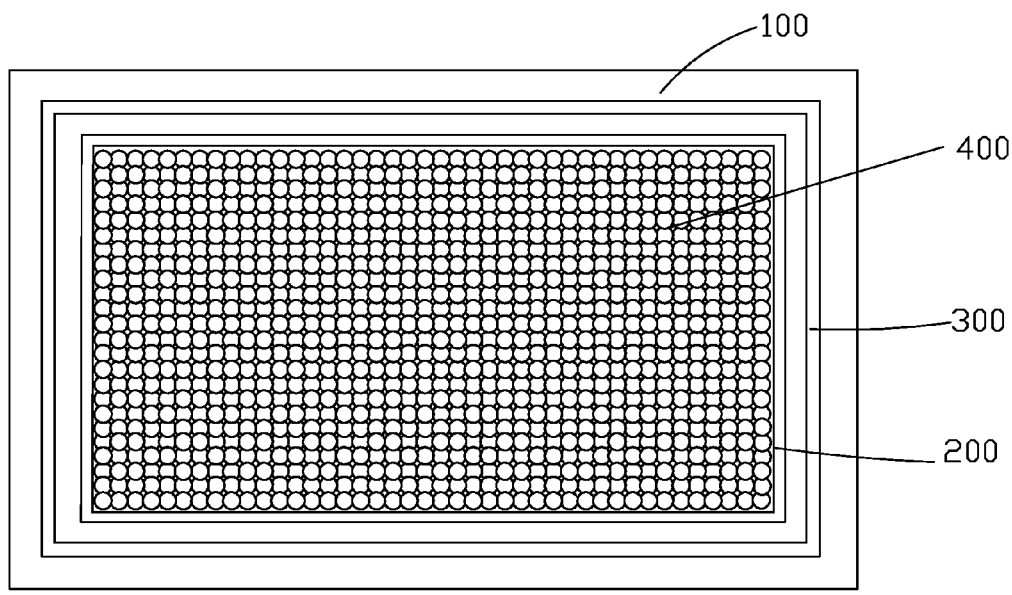
FIG. 2 is a diagram of a package plate after lamination of the package plate and the OLED substrate according to the package method of the OLED substrate of prior art.
Figure 3:
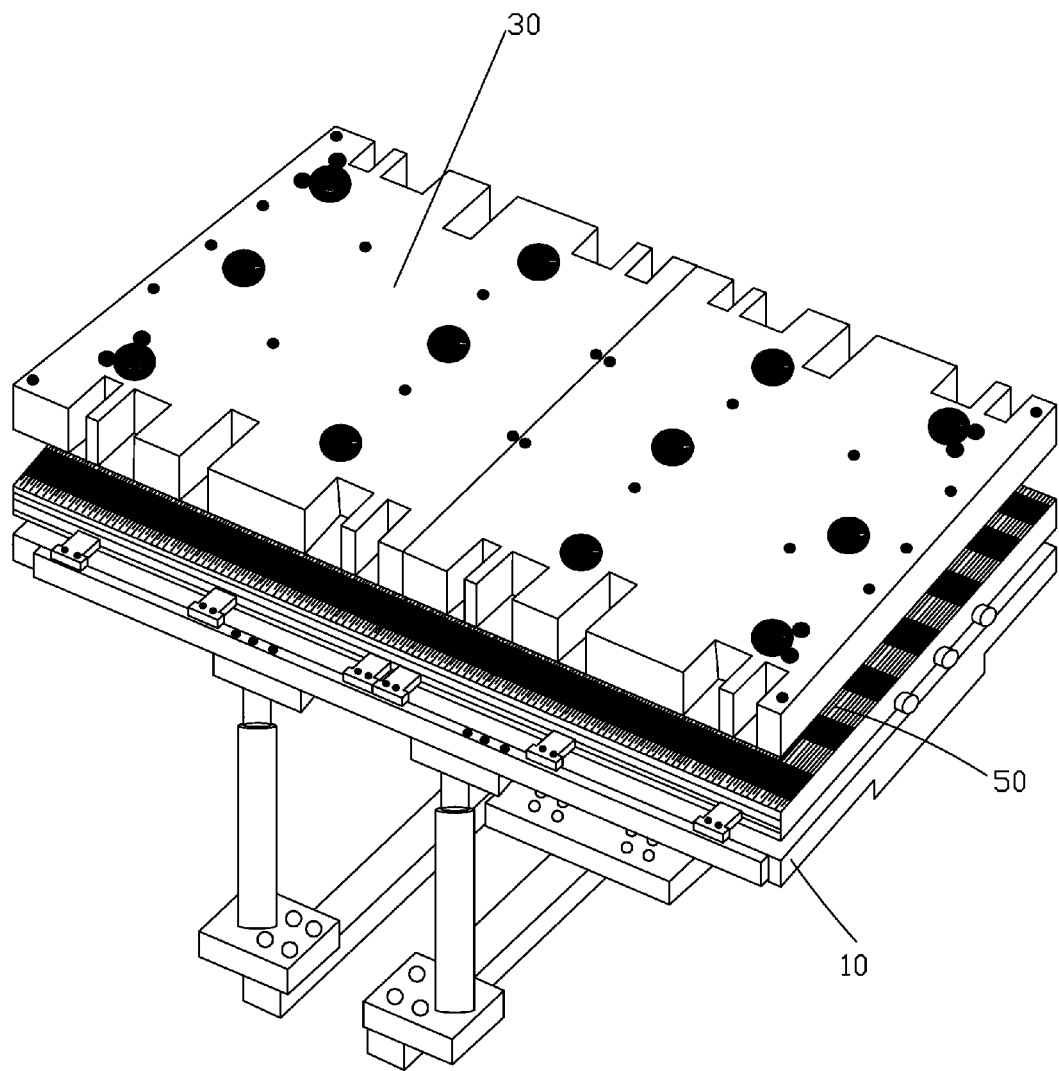
FIG. 3 is a structural diagram of an OLED package device according to the present invention.
Figure 4:
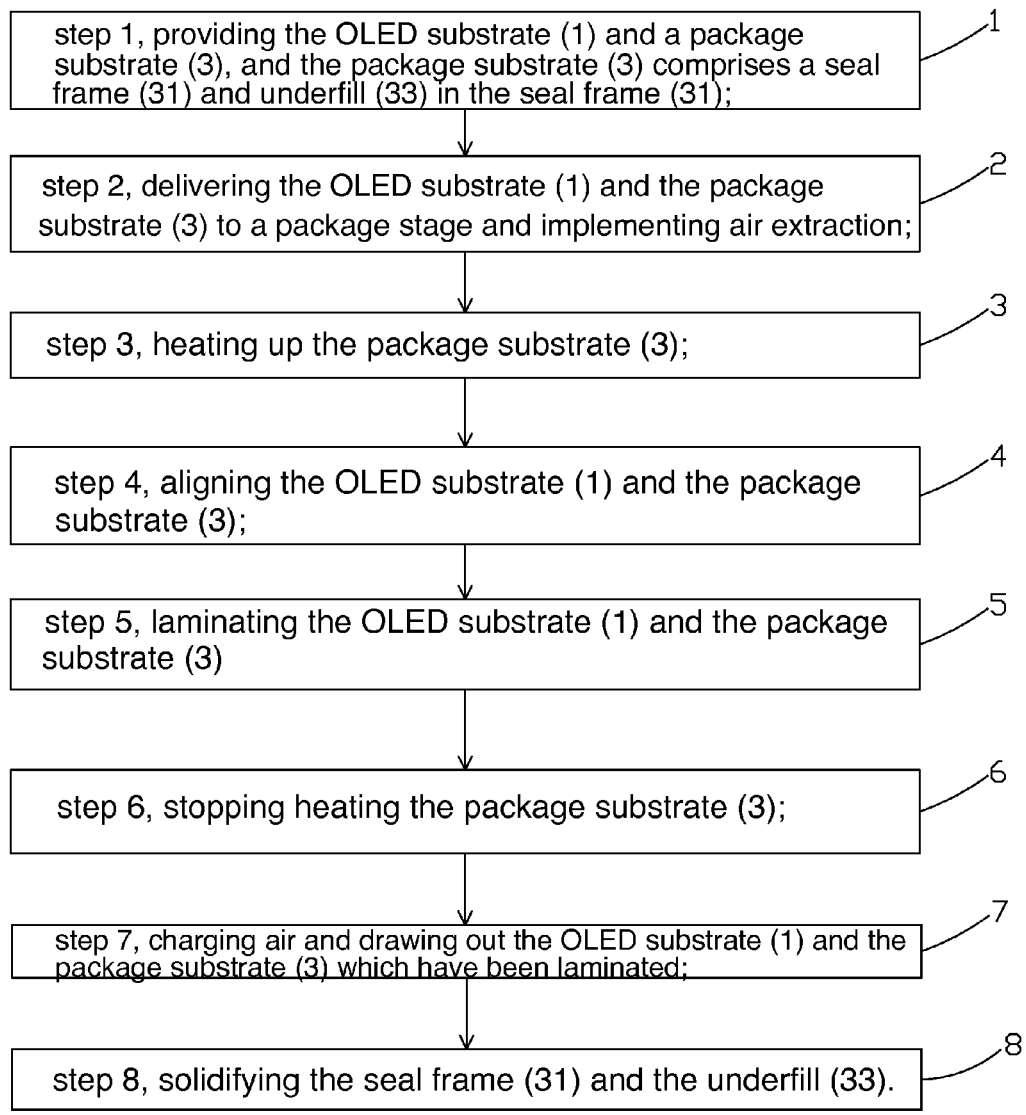
FIG. 4 is a flowchart of a package method of an OLED panel according to the present invention.

Please refer from FIG. 3. The present invention provides an OLED package device, comprising: a base body 10, a lower stage 30 installed on the base body 10 and a heating device 50 installed between the base body 10 and the lower stage 30, and the lower stage 30 is employed to load a package plate, and the heating device 50 can heat the lower stage, and the lower stage 30 passes heat to the package plate for heating up the package plate.

The heating device 50 starts to heat as implementing as extracting air.

The heating device 50 heats for heating up the package plate, and the temperature of the package plate is controlled under 80° C.

The temperature of the package plate is controlled in a range of 30-50° C.

The heating device 50 stops heating when an OLED substrate and the package plate are being laminated.

The package substrate comprises a seal frame and underfill in the seal frame. The heating device heats up the lower stage 30. The lower stage 30 passes heat to the package plate. When the package plate is heated up, the underfill is also heated up and the temperature is raised. The viscosity of the underfill is descended as the temperature thereof is raised. Accordingly, the drag force can be diminished during the air extraction to filling the underfill in the frame to improve package result.

Please refer from FIG. 4 to FIG. 11. On the basis of the OLED package device of the present invention, the present invention further provides a package method of an OLED package, comprising steps of:

Step 1, providing the OLED substrate 1 and a package substrate 3, and the package substrate 3 comprises a seal frame 31 and underfill 33 in the seal frame 31.

Figure 5:
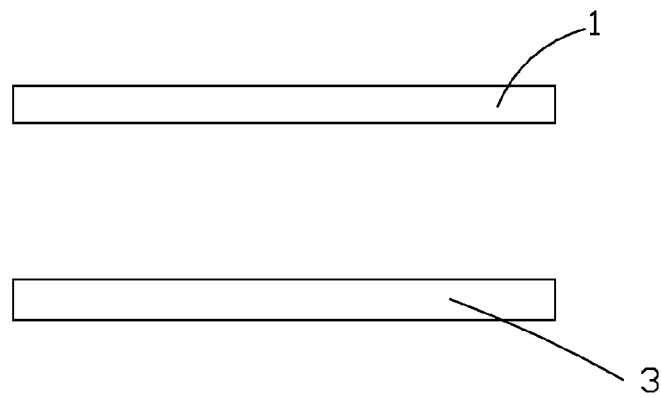
FIG. 5 is a diagram of step 1 in the package method of the OLED panel according to the present invention.
Figure 6:
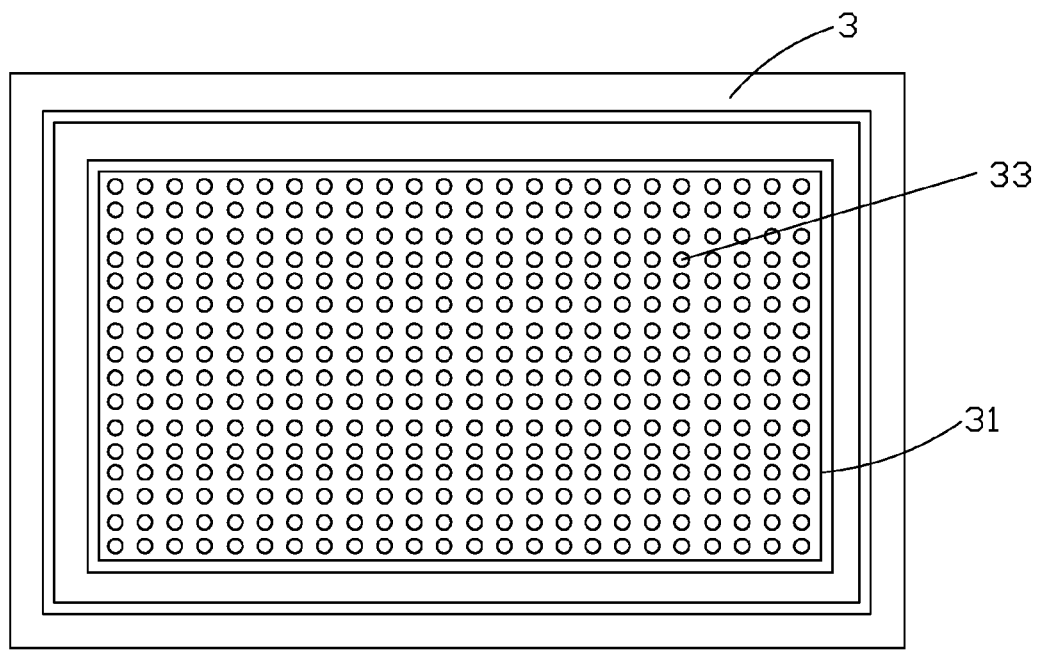
FIG. 6 is a diagram of a package plate in step 1 of the package method of the OLED panel according to the present invention.

Specifically as shown in FIG. 5 and FIG. 6, the OLED substrate 1 and the package substrate 3 are transparent substrate. Preferably, the OLED substrate 1 and the package substrate 3 are transparent substrate, and the seal frame 31 is formed by coating with UV glue, and the underfill 33 is a liquid transparent drier.

Step 2, delivering the OLED substrate 1 and the package substrate 3 to a package stage and implementing air extraction.

Specifically, the OLED substrate 1 is loaded on an upper stage 70 of the OLED package device. The package plate 3 is loaded on the lower stage 30. The air extraction device 80 implements air extraction until the pressure reaches up to 1000 Pa for squeezing out the bubbles in the underfill 33.

Step 3, heating up the package substrate 3.

Figure 7:
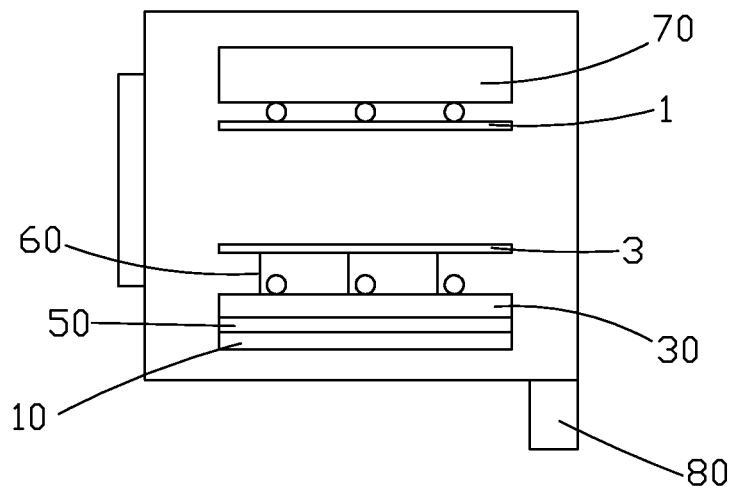
FIG. 7 is a diagram of step 3 in the package method of the OLED panel according to the present invention.

Specifically as shown in FIG. 7, as the step 6 of air extraction is implemented, the heating device 50 is activated to heat up the package plate 3 and raise the temperature thereof. In the step 3, the temperature of the package plate is controlled under 80° C. because the seal frame 31 and the underfill 33 are solidified at about 80~120° C. in the following step 8. Moreover, the viscosity of the underfill 33 is lower. The viscosity will be kept at the lowest point and steady when it is heated up to a certain temperature, such as about 30-50° C. Preferably, the temperature of package plate 3 is controlled in a range of 30-50° C. When the package plate 3 is heated up, the underfill 33 is also heated up and the temperature is raised. The viscosity of the underfill 33 is descended as the underfill 33 is heated, the temperature is raised. Accordingly, the drag force can be diminished during the air extraction to filling the underfill in the frame to improve package result.

Step 4, aligning the OLED substrate 1 and the package substrate 3.

Figure 8:
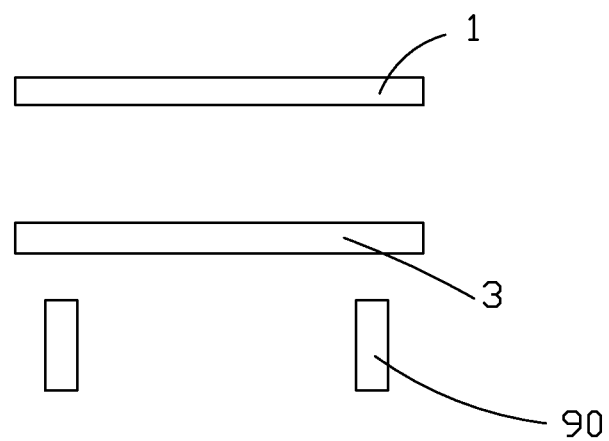
FIG. 8 is a diagram of step 4 in the package method of the OLED panel according to the present invention.

Specifically as shown in FIG. 8, the coincidence condition of the alignment marks of the OLED substrate 1 and the package substrate 3 are observed with a camera 90 until the alignment marks of the OLED substrate 1 and the package substrate 3 are completely and precisely coincided.

Step 5, laminating the OLED substrate 1 and the package substrate 3.

Figure 9:
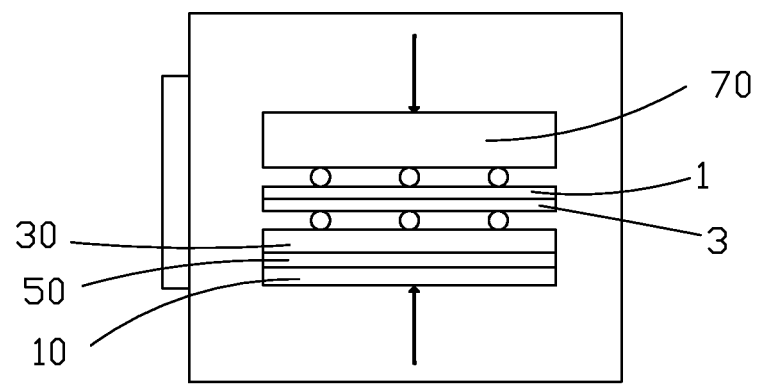
FIG. 9 is a diagram of step 5 in the package method of the OLED panel according to the present invention.

Specifically as shown in FIG. 9, the upper stage 70 and the lower stage 30 comes close to laminate the OLED substrate 1 and the package substrate 3.

Step 6, stopping heating the package substrate 3.

Specifically, the step 6 and the step 5 are implemented simultaneously. The heating device 50 is controlled to stop heating and to be activate cooling function when the OLED substrate 1 and the package substrate 3 is being laminated.

Step 7, charging air and drawing out the OLED substrate 1 and the package substrate 3 which have been laminated.

Figure 10:
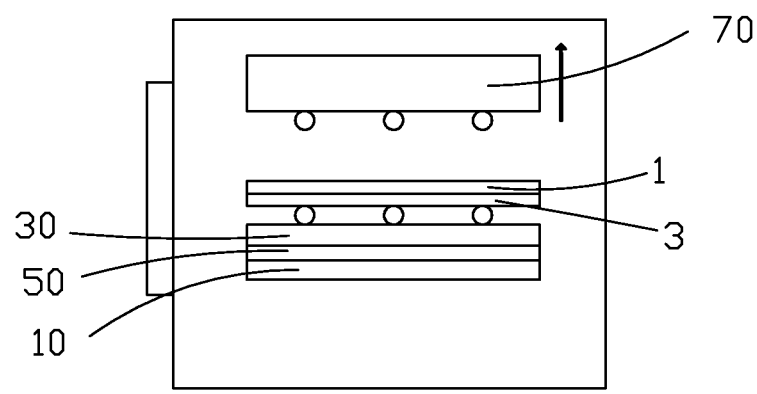
FIG. 10 and FIG. 11 are diagrams of step 7 in the package method of the OLED panel according to the present invention.
Figure 11:
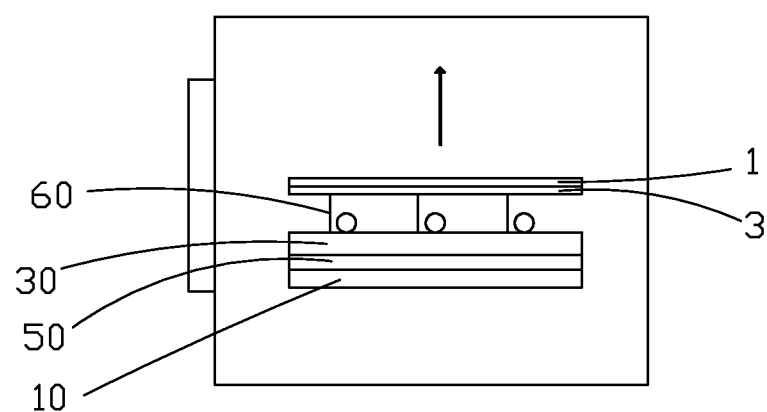

Specifically as shown in FIG. 10 and FIG. 11, the upper stage 70 is lift up first and air is charged at the same time. With the pressure, the OLED substrate 1 and the package substrate 3 is laminated in advance; The OLED substrate 1 and the package substrate 3 which have been laminated are lift up by pins 60 to make them get easy to be drawn out.

Step 8, solidifying the seal frame 31 and the underfill 33.

Specifically, an UV light is utilized to irradiate the seal glue and the underfill and solidify both. Accordingly, the package of the OLED panel is realized.

In conclusion, in the OLED package device of the present invention, with installing the heating device between the base body and the lower stage, and the heating device heats up the package plate. The viscosity of the underfill is descended after heating up. The drag force can be diminished during the air extraction to allow the bubbles in the underfill get easy to be squeezed out. Accordingly, the issue of existing bubbles in underfill which is under filled as implementing Dam & Fill package can be solved. The package result can be improved. The performance of the OLED elements can be raised and the lifetime of the OLED elements can be extended. With heating the package substrate according to the package method of the OLED panel, the viscosity of the underfill is descended after heating up. The drag force can be diminished during the air extraction to allow the bubbles in the underfill get easy to be squeezed out. It is capable of making no bubble among adhesives of the underfill and filling the underfill in the frame for guaranteeing a good package result. Accordingly, the performance of the OLED elements can be raised, and the lifetime of the OLED elements can be extended.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. An organic light emitting diode (OLED) package device, comprising: a base body, a lower stage installed on the base body and a heating device installed between the base body and the lower stage, wherein the lower stage is employed to load a package plate, which comprises a seal frame formed thereon to define a circumferentially enclosed interior space and an underfill deposited on the package plate in the interior space, the underfill containing air voids therein, and the heating device is operable to apply heat to the lower stage to allow the lower stage to transmit the heat to the package plate for increasing a temperature of the underfill deposited on the package plate such that viscosity of the underfill is decreased to allow for releasing and removing the air voids from the underfill in a condition of evacuation.

2. The OLED package device according to claim 1, wherein the heating device starts to apply the heat as implementing as extracting air in the condition of evacuation.

3. The OLED package device according to claim 1, wherein the heating device applies heat that is transmitted to the package plate, such that a temperature of the package plate is controlled under 80° C.

4. The OLED package device according to claim 3, wherein the temperature of the package plate is controlled in a range of 30-50° C.

5. The OLED package device according to claim 1, wherein the heating device stops heating when an OLED substrate and the package plate are being laminated.

6. An organic light emitting diode (OLED) package device, comprising: a base body, a lower stage installed on the base body and a heating device installed between the base body and the lower stage, wherein the lower stage is employed to load a package plate, which comprises a seal frame formed thereon to define a circumferentially enclosed interior space and an underfill deposited on the package plate in the interior space, the underfill containing air voids therein, and the heating device is operable to apply heat to the lower stage to allow the lower stage to transmit the heat to the package plate for increasing a temperature of the underfill deposited on the package plate such that viscosity of the underfill is decreased to allow for releasing and removing the air voids from the underfill in a condition of evacuation;
  wherein the heating device starts to apply the heat as implementing as extracting air in the condition of evacuation;
  wherein the heating device applies heat that is transmitted to the package plate, such that a temperature of the package plate is controlled in a range of 30-50° C.; and
  wherein the heating device stops heating when an OLED substrate and the package plate are being laminated.

7. A package method of an organic light emitting diode (OLED) panel, comprising steps of:
  step 1, providing the OLED substrate and a package substrate, and the package substrate comprises a seal frame that defines a circumferentially enclosed interior space, and an underfill deposited in the interior space of the seal frame, the underfill containing air voids therein;

step 2, delivering the OLED substrate and the package substrate to a package stage and implementing evacuation for air extraction;

step 3, heating up the package substrate such that a temperature of the underfill is increased to decrease viscosity of the underfill to allow for releasing and removing the air voids from the underfill during the evacuation;

step 4, aligning the OLED substrate and the package substrate;

step 5, laminating the OLED substrate and the package substrate;

step 6, stopping heating the package substrate;

step 7, charging air and drawing out the OLED substrate and the package substrate which have been laminated; and step 8, solidifying the seal frame and the underfill.

8. The package method of the OLED panel according to claim 7, wherein the package plate starts to be heated as implementing as extracting air.

9. The package method of the OLED panel according to claim 7, wherein in the third step of heating up the package substrate, a temperature of the package plate is controlled under 80° C.

10. The package method of the OLED panel according to claim 9, wherein the temperature of the package plate is controlled in a range of 30-50° C.

11. The package method of the OLED panel according to claim 7, wherein heating is stopped when the OLED substrate and the package plate are being laminated.

* * * * *